(12) United States Patent
Li et al.

(10) Patent No.: US 7,145,239 B2
(45) Date of Patent: Dec. 5, 2006

(54) CIRCUIT BOARD WITH TRACE CONFIGURATION FOR HIGH-SPEED DIGITAL DIFFERENTIAL SIGNALING

(75) Inventors: Yuan-Liang Li, Chandler, AZ (US); Jiangqi He, Chandler, AZ (US); Dong Zhong, Chandler, AZ (US); David G. Figueroa, Mesa, AZ (US)

(73) Assignee: Intel Corporation, Santa Clara, CA (US)

( * ) Notice: Subject to any disclaimer, the term of this patent is extended or adjusted under 35 U.S.C. 154(b) by 0 days.

(21) Appl. No.: 10/977,192

(22) Filed: Oct. 29, 2004

(65) Prior Publication Data

US 2005/0139391 A1 Jun. 30, 2005

Related U.S. Application Data

(62) Division of application No. 10/167,904, filed on Jun. 12, 2002, now Pat. No. 6,914,334.

(51) Int. Cl.
*H01L 23/48* (2006.01)
(52) U.S. Cl. ...................... 257/752; 257/758
(58) Field of Classification Search ............. 257/752, 257/758, 766
See application file for complete search history.

(56) References Cited

U.S. PATENT DOCUMENTS

| 4,712,161 A | * | 12/1987 | Pryor et al. ................. 361/779 |
| 4,777,718 A | * | 10/1988 | Henderson et al. ........... 29/620 |
| 5,408,053 A | | 4/1995 | Young ........................ 174/264 |
| 5,734,560 A | * | 3/1998 | Kamperman et al. ....... 361/774 |
| 6,914,334 B1 | | 7/2005 | Li et al. |

* cited by examiner

*Primary Examiner*—Leonardo Andujar
(74) *Attorney, Agent, or Firm*—Schwegman, Lundberg, Woessner & Kluth, P.A.

(57) ABSTRACT

Trace configurations for carrying high-speed digital differential signals provide for reduced conduction loss and improved signal integrity. In one embodiment, a circuit board has a first set of conductive traces disposed on non-conductive material, and a second set of conductive traces parallel to the first set and disposed within the conductive material. The second set is separated from the first set by non-conductive material. Corresponding traces of the first and second sets may be in a stacked configuration. In other embodiments, conductive material may be provided between corresponding traces of the first and second sets resulting in an "I-shaped" or "U-shaped" cross-section. In yet other embodiments, the trace configurations have "T-shaped" and "L-shaped" cross-sections.

14 Claims, 5 Drawing Sheets

CIRCUIT BOARD WITH TRACE CONFIGURATION FOR HIGH-SPEED DIGITAL DIFFERENTIAL SIGNALING

This application is a divisional of U.S. patent application Ser. No. 10/167,904, filed on Jun. 12, 2002, now issued as U.S. Pat. No. 6,914,334, which is incorporated herein by reference.

FIELD OF THE INVENTION

The present invention pertains to high-speed digital differential signaling and in one embodiment, to circuit boards with traces for communicating high-speed digital differential signals.

BACKGROUND OF THE INVENTION

Digital signals, including digital differential signals, are used for signal transmission on circuit boards, integrated circuit packages, interposer substrates and motherboards to help protect a signal from picking up external noise. Digital differential signals are also used in computer systems and communication systems such as a local area network (LAN) system. A digital differential signal has two components that are 180 degrees out-of-phase with each other. The signal components transition between digital values of zero and one which may be represented by particular voltages. Digital differential signals are conventionally transmitted using a pair of traces spaced closely together on a circuit board or substrate. Each trace of the pair carries one of the components of the digital differential signal. FIG. 1 illustrates a cross-section of a portion of a circuit board with a pair of traces for communicating digital differential signals in accordance with the prior art. Circuit board 100 has trace pair 102 on insulating substrate 104. Conductive ground plane 106 is on a side of substrate 104 opposite to traces 102. Trace pair 102 illustrates a pair of closely spaced traces that have been conventionally used to carry digital differential signals. Because the signal components are out-of-phase, coupling between the traces reduces the signal's susceptibility to external noise. The darkened/solid areas (e.g., trace pairs 102 and ground plane 106) illustrated in the informal drawings are conductive material while the non-darkened areas may be a non-conductive or insulating material.

Semiconductor devices, computers, and other elements in digital systems continue to increase their operating data rate requiring the communication of digital differential signals of increasingly higher transition-rates. The transition-rate refers to the rate at which a digital signal transitions between states. In the near future, digital devices may require high-speed input/output (I/O) communications using digital differential signals, which may exceed rates of one giga-transition per second, and even rates of even ten giga-transition per second. One problem with conventional circuit board trace pairs is that as the transition-rate increases, conduction loss also increases. Furthermore, as the transition-rate increases, signal integrity degrades. Conventional circuit board trace pairs for carrying digital differential signals may have upper limits of less than one or ten giga-transitions per second and are therefore generally unsuitable for carrying higher rate digital differential signals. Digital differential signals above one and especially above ten giga-transitions per second when communicated over conventional trace pairs results in unacceptably high conduction loss and reduction in signal quality and integrity.

One technique that has been used to help reduce the increase in conduction loss associated with high transition-rate digital differential signals is increasing the trace width. Increased trace widths, however, reduce signal routing ability and consume more area on a circuit board, substrate or package, for example. Increased trace width also results in higher dielectric loss due to increased capacitance, which contributes to the reduction in signal quality and integrity.

Thus there is a need for improved communication of high-speed digital differential signals. There is also a need for a circuit board having traces suitable for communication of high-speed digital differential signals. There is also a need for traces for communicating high-speed digital differential signals with reduced conduction loss. There is also a need for traces for communicating high-speed digital differential signals with reduced dielectric loss. There is also a need for traces for communicating high-speed digital differential signals that help maintain signal integrity.

BRIEF DESCRIPTION OF THE DRAWINGS

The invention is pointed out with particularity in the appended claims. However, a more complete understanding of the present invention may be derived by referring to the detailed description when considered in connection with the figures, wherein like reference numbers refer to similar items throughout the figures and:

The description set out herein illustrates the various embodiments of the invention and such description is not intended to be construed as limiting in any manner.

DETAILED DESCRIPTION

Figure 2:
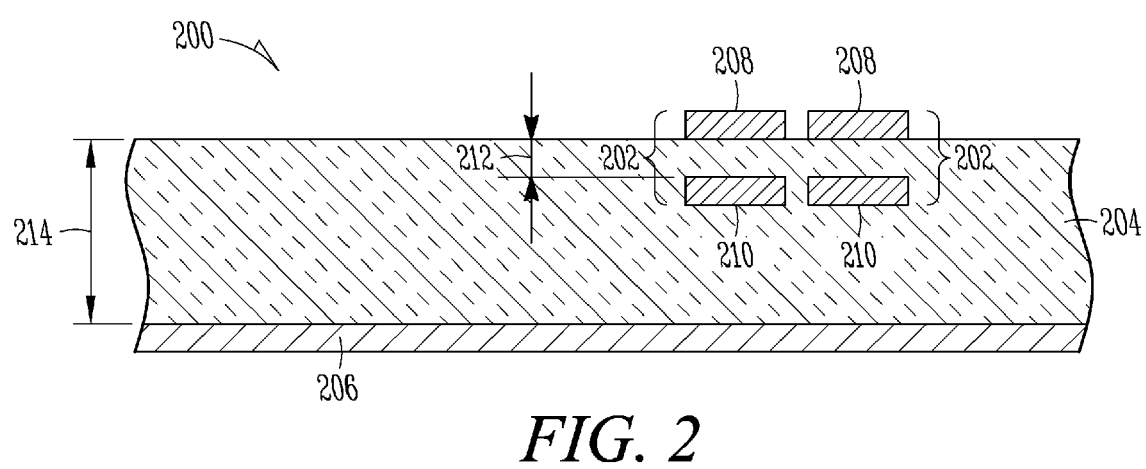
FIGS. 2, 3A, 4, 5 and 6 illustrate cross-sections of circuit boards for communicating high-speed digital differential signals in accordance with various embodiment of the present invention.

The present invention relates to circuit boards having traces for communicating digital signals, and in at least one embodiment, relates to circuit boards having traces for communicating high-speed digital signals and high speed digital differential signals. High-speed digital signals may include signals having transition rates up to and exceeding one giga-transition per second, and may even include signals having transition rates of greater than ten giga-transitions per second. Although this detailed description specifically refers to several embodiments of the present invention for communication of digital differential signals, these embodiments are equally suitable to the communication of other types of digital signals, including signals which do not have out-of-phase components. FIG. 2 illustrates a cross-section of a portion of a circuit board having traces for communicating high-speed digital differential signals in accordance with one embodiment of the present invention. Circuit board 200 includes insulating substrate 204 having a pair of traces 202 and conductive ground plane 206. Ground plane 206 is located on a side of insulating substrate 204 opposite to trace pair 202.

In the embodiment illustrated in FIG. 2, trace pair 202 includes first set of conductive traces 208 disposed on a surface of substrate 204, and second set of conductive traces 210 which may be parallel to first set 208 and disposed within non-conductive material. Second set 210 is separated from first set 208 by the insulating material of substrate 204. In the illustrated embodiment, corresponding traces of first and second sets 208, 210 are in a stacked configuration and is referred to as the "stacked trace" embodiment of the present invention. The ends of each trace of pair 202 may be electrically coupled together so that the corresponding traces of the pair function substantially as one conductor. The corresponding traces of pair 202 may carry a component of a high-speed digital differential signal.

The dielectric constant (Er) of substrate 204 may be increased over that of conventional circuit board substrates to compensate for the closer proximity of traces of set 210 to ground plane 206. The dielectric constant of substrate 204 may, for example, range at least between 3 and 4, although substrates and insulating materials having other dielectric constants may be equally suitable. In the example illustrated, thickness 214 of substrate 206 may, for example, range between 20 and 40 microns, width of traces of sets 208 and 210 may range, for example, between 20 and 40 microns, and thickness of traces of sets 208 and 210 may range, for example, between 10 and 20 microns. Spacing 212 between traces of sets 208 and 210 may, for example, be on the order of ten microns or less. The present invention is equally suitable to circuit boards and traces having different dimensions and characteristics.

Figure 3A:
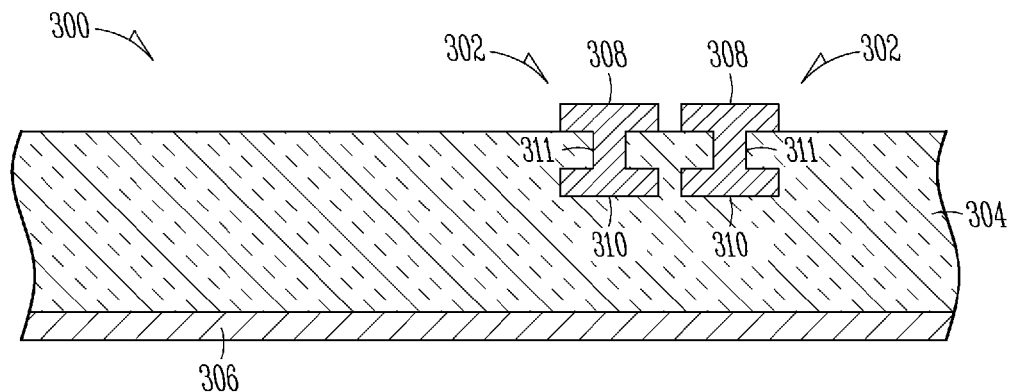
Figure 3B:
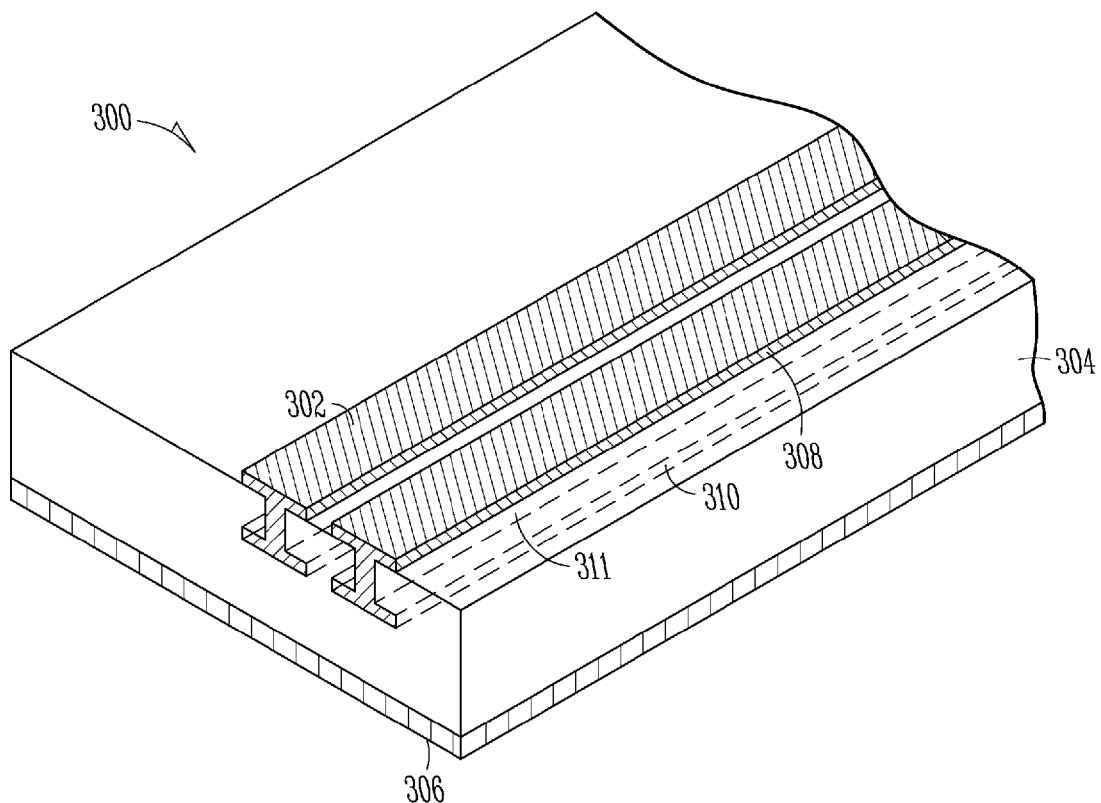
FIG. 3B illustrates a perspective view of the circuit board of FIG. 3A in accordance with some embodiments of the present invention.

FIG. 3 illustrates a cross-section of a portion of a circuit board having traces for communicating high-speed digital differential signals in accordance with another embodiment of the present invention. Circuit board 300 includes insulating substrate 304 having trace pair 302 and conductive ground plane 306. Ground plane 306 is located on a side of insulating substrate 304 opposite to trace pair 302. Trace pair 302 is comprised of a trace sets 308 and 310 coupled with conductive material 311. The embodiment of the present invention illustrated in FIG. 3 is similar to circuit board 200 (FIG. 2) except that traces of sets 308 and 310 are coupled by conductive material 311. Conductive material 311 may run the length of trace pair 302. This embodiment of the present invention is referred to as the "I-shaped" embodiment because the cross-section of the traces of pair 302 is similar to a capital "I". Traces of sets 308 and 310 may be spaced closely together, and may be separated by a thin layer of insulating material.

Figure 4:
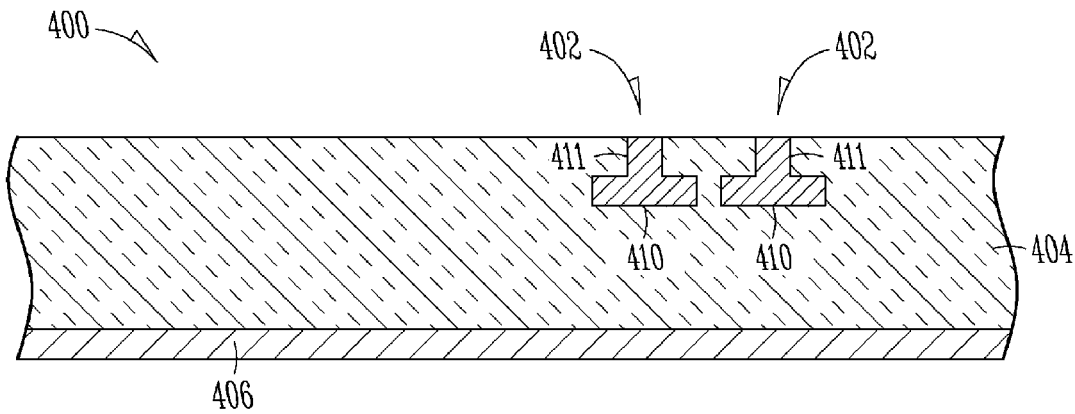

FIG. 4 illustrates a cross-section of a portion of a circuit board having traces for communicating high-speed digital differential signals in accordance with another embodiment of the present invention. Circuit board 400 includes insulating substrate 404 having trace pair 402 and conductive ground plane 406. Trace pair 402 includes trace set 410 located within substrate 404, and conductive portions 411 which may couple traces of set 410 throughout their length. Conductive portions 411 may have a portion exposed on the surface of substrate 404. This embodiment of the present invention is referred to as the "T-shaped" embodiment because the cross-section of the traces of pair 402 is similar to an inverted capital "T".

Figure 5:
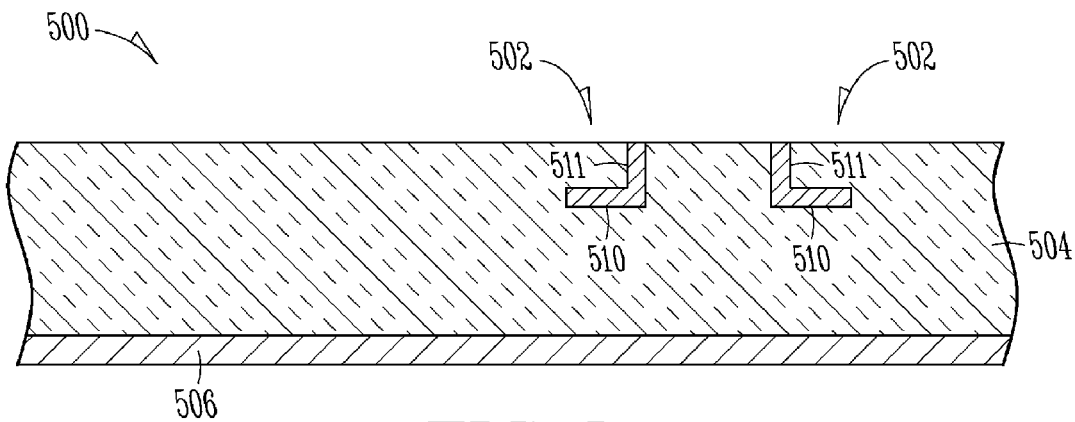

FIG. 5 illustrates a cross-section of a portion of a circuit board having traces for communicating high-speed digital differential signals in accordance with another embodiment of the present invention. Circuit board 500 includes insulating substrate 504 having trace pair 502 and conductive ground plane 506. Trace pair 502 includes trace set 510 located within substrate 504, and conductive portions 511 which may couple traces of set 510 throughout their length. Conductive portions 511 may have a portion exposed on the surface of substrate 504. This embodiment of the present invention is referred to as the "L-shaped" embodiment because the cross-section of the traces of pair 502 is similar to a capital "L". In this embodiment, conductive portions 511 may be positioned on the near sides of traces 510 as illustrated, or alternatively may be positioned on the far sides of traces 510.

Figure 6:
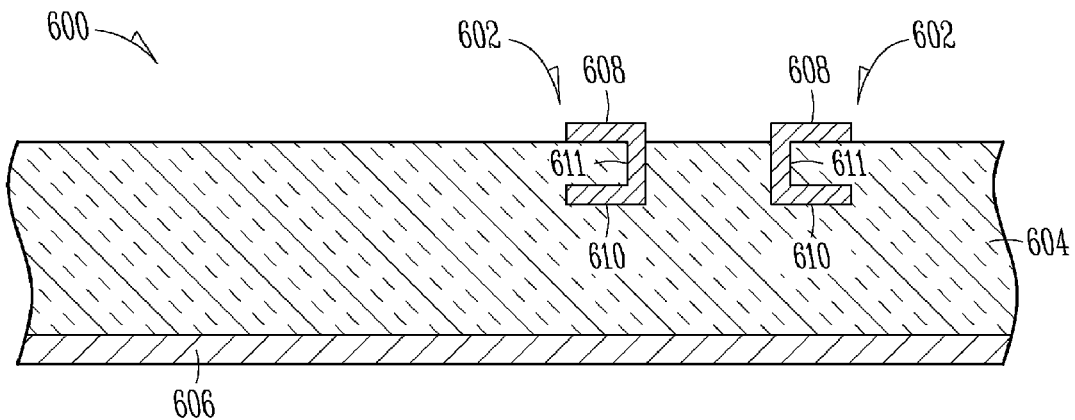

FIG. 6 illustrates a cross-section of a portion of a circuit board having traces for communicating high-speed digital differential signals in accordance with another embodiment of the present invention. Circuit board 600 includes insulating substrate 604 having trace pair 602 and conductive ground plane 606. Trace pair 602 includes traces of set 610 located within substrate 604, traces of set 608 located on a surface of substrate 604, and conductive portions 611 which may couple traces of sets 610 and 608 throughout their length. Traces of sets 608 and 610 may be spaced very closely together. This embodiment of the present invention is referred to as the "U-shaped" embodiment because the cross-section of the traces of pair 602 is similar to a sideways capital "U". In this embodiment, conductive portions 611 may be positioned on the near sides of traces 610 and 608 as illustrated, or alternatively may be positioned on the far sides of traces 610 and 608 (not illustrated).

Figure 1:
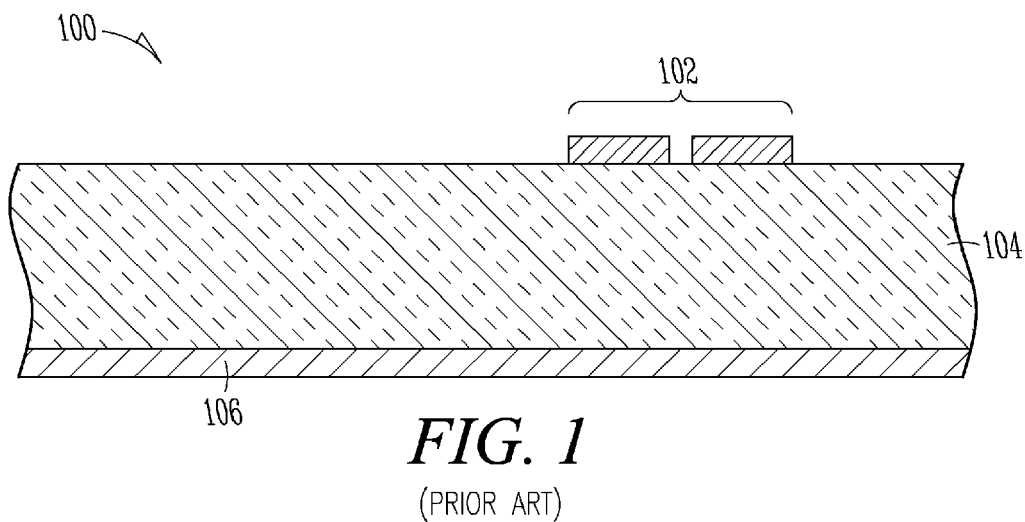
FIG. 1 illustrates a cross-section of a portion of a circuit board having trace pairs for communicating digital differential signals in accordance with the prior art.

The trace pairs of the various embodiments of the present invention may provide for reduced conduction loss over conventional trace pairs used to carry digital differential signals. For example, the conventional trace pair for communicating digital differential signals illustrated in FIG. 1 may have a DC resistance of approximately 0.22 Ohms per 2.54 centimeters and an AC resistance of approximated 0.33 Ohms per 2.54 centimeters. The "stacked trace" embodiment illustrated in FIG. 2 may have a DC resistance of approximately 0.11 Ohms per 2.54 centimeters and an AC resistance of approximated 0.21 Ohms per 2.54 centimeters. The "I-shaped" embodiment illustrated in FIG. 3 may have a DC resistance of approximately 0.07 Ohms per 2.54 centimeters and an AC resistance of approximated 0.20 Ohms per 2.54 centimeters. The "T-shaped" embodiment illustrated in FIG. 4 may have a DC resistance of approximately 0.11 Ohms per 2.54 centimeters and an AC resistance of approximated 0.21 Ohms per 2.54 centimeters. The "L-shaped" embodiment illustrated in FIG. 5 may have a DC resistance of approximately 0.14 Ohms per 2.54 centimeters and an AC resistance of approximated 0.24 Ohms per 2.54 centimeters. The "U-shaped" embodiment illustrated in FIG. 6 may have a DC resistance of approximately 0.086 Ohms per 2.54 centimeters and an AC resistance of approximated 0.19 Ohms per 2.54 centimeters.

The trace pairs of the various embodiments of the present invention may also provide for improved signal integrity over conventional trace pairs used to carry digital differential signals. For example, when measured and viewed with an eye diagram, the percentage at which the signal is at a final state (e.g., not in transition between states) is the percentage of the eye diagram. The percentage of the eye diagram is approximately 74.5% for the conventional trace pair of FIG. 1 for a digital differential signal having a transition-rate around ten giga-transitions per second. The percentage of the eye diagram, for example, is approximately 86.8% for the "L-shaped" embodiment illustrated in FIG. 5. The percentage of the eye diagram, for example, is approximately 88.8% for the "U-shaped" embodiment illustrated in FIG. 6.

The present invention is not limited to the illustrated embodiments. Other embodiments of the present invention that are not illustrated include, for example, a "non-inverted T-shaped" embodiment and an "inverted L-shaped" embodiment.

The trace configurations of the present invention may be suitable for carrying high-speed digital differential signals in a package to and from a semiconductor die. The trace configurations of the present invention may also be suitable for carrying high-speed digital differential signals on an interposer substrate, which may be located between a packaged die and a circuit board. The trace configurations of the present invention may also be suitable for carrying high-speed digital differential signals on circuit boards such as a motherboard of a computer. The trace configurations of the present invention may also be suitable for carrying high-speed digital differential signals between, for example, a high-speed microprocessor and other elements on a motherboard. The trace configurations of the present invention may also be suitable for carrying high-speed digital differential signals to various I/O elements of a computer system.

Figure 7A:
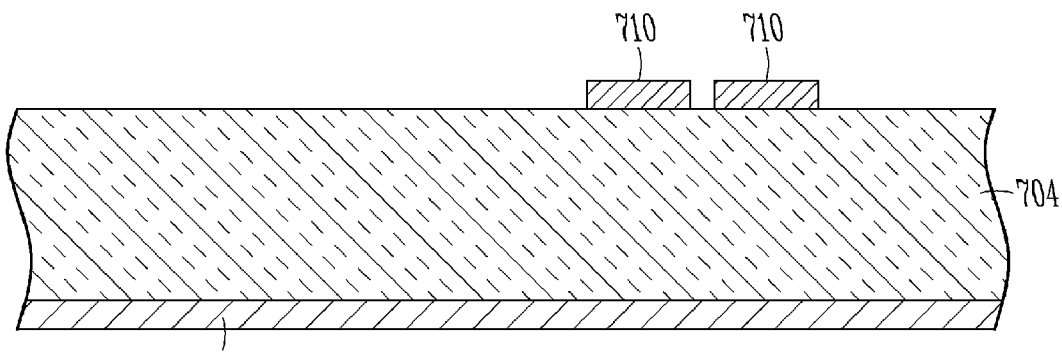
FIGS. 7A, 7B and 7C illustrate the fabrication of a circuit board in accordance with an embodiment of the present invention.
Figure 7B:
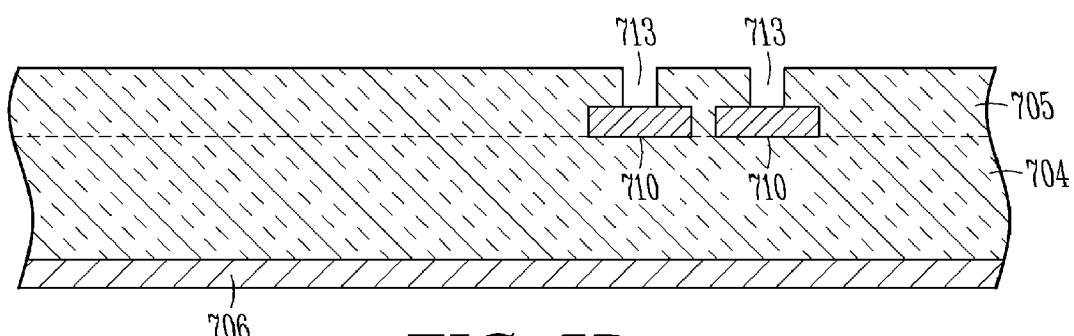
Figure 7C:
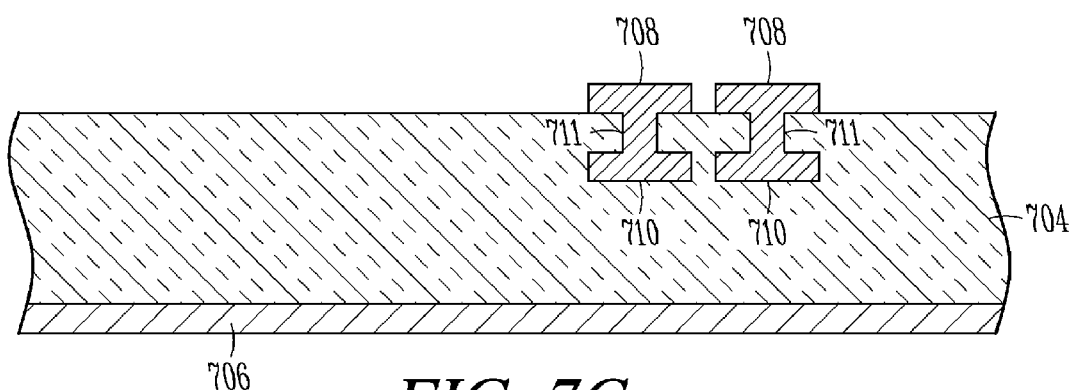

FIGS. 7A, 7B and 7C illustrate the fabrication of a circuit board in accordance with an embodiment of the present invention. FIGS. 7A, 7B and 7C may be part of a procedure for fabrication of a circuit board in accordance with several embodiments of the present invention. Although the individual operations are illustrated and described as separate operations, it should be noted that one or more of the individual operations may be performed concurrently. The procedure is described for the fabrication of a trace pair for carrying a high-speed digital differential signal, however, many more trace pairs for carrying other high-speed digital differential signals may be concurrently fabricated. Although FIGS. 7A, 7B and 7C illustrate the fabrication of the "I-shaped" embodiment described in FIG. 3, this procedure may be used to fabricate other embodiments of the present invention.

In FIG. 7A, trace pair 710 is fabricated on a circuit board having insulating substrate 704 and ground plane 706 on a side opposite of trace pairs 710. In FIG. 7B, insulating material 705 is added to substrate 704. Insulating material may be a thin layer of insulating material, and may be the same or similar to the insulating material of substrate 704. As part of the operation illustrated in FIG. 7B, trenches 713 may be formed through insulating material 705. The position of trenches 713 depends on whether the "I-shaped" embodiment, the "T-shaped" embodiment, the "L-shaped" embodiment, or the "U-shaped" embodiment is being fabricated. When fabricating the "stacked trace" embodiment, trenches 713 do not need to be formed, however "holes" for conductive paths through insulating material 705 may be formed at or near the ends of the traces of trace pair 710.

In FIG. 7C, trenches 713 are filled with conductive material 711 to complete the "T-shaped" and the "L-shaped" embodiment. For the "stacked trace" embodiment, the holes near the end of traces 710 are filled with conductive material. For the "I-shaped" embodiment, the "sideways U-shaped" embodiment, and the "stacked trace" embodiment, traces 708 are fabricated on the surface of insulating material 705.

Various conductive materials may be used for traces 708, traces 710, ground plane 706, and conductive material 711 including, for example, gold, copper, and aluminum, and various alloys and combinations thereof. Various insulating materials may also be used for substrate 704 and insulating material 705 including, for example, dielectric material having a dielectric constant (Er) ranging at least from 3 to 4, and may include materials such as Duroid, and may also include materials having different dielectric constants such as aluminia. Although insulating material 705 may be the same or similar to the material of substrate 704, this is not a requirement: insulating material 705 may be different from the material of substrate 704.

Figure 8:
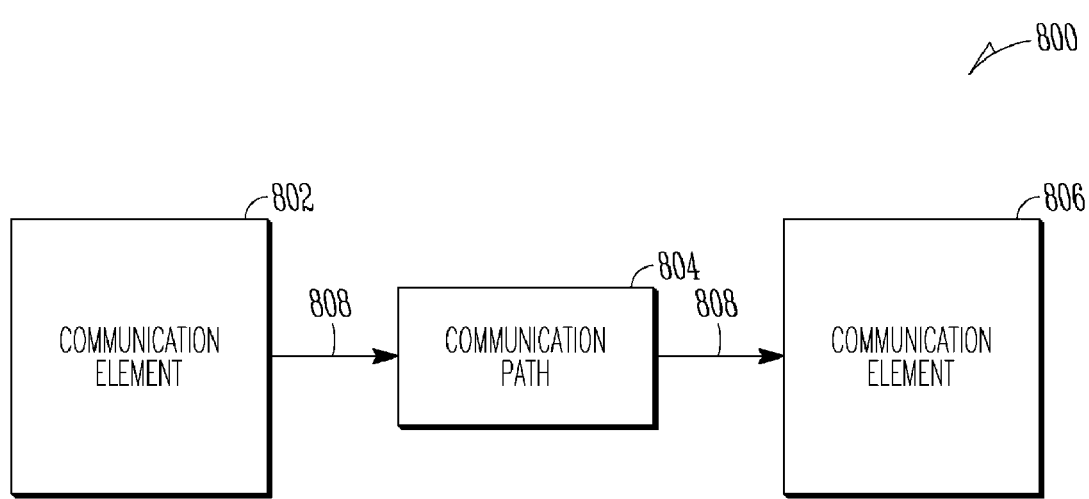
FIG. 8 is a highly simplified functional block diagram of a system in accordance with an embodiment of the present invention.

FIG. 8 is a highly simplified functional block diagram of a system in accordance with an embodiment of the present invention. System 800 comprises first and second communication elements 802, 806, with communication path 804 therebetween. First communication element 802 may provide digital differential signal 808, and second communication element 806 may receive digital differential signal 808. Communication path 804 may carry the digital differential signal between first and second communication elements 802, 806. Communication path 804 may include a first set of conductive traces disposed on insulating material, and a second set of conductive traces parallel to the first set and disposed within the insulating material and may be separated from the first set by the insulating material. In one embodiment, corresponding traces of the first and second sets may be in a stacked configuration. The corresponding traces of the first and second sets may carry a portion of the digital differential signal, and may be electrically coupled at one end. The first and second communication elements may part of a communication system, a computer system, or other system that communicates digital differential signals between elements.

The trace configurations illustrated in FIGS. 2–7 are suitable for use as part of communication path 804, although other trace configurations are also suitable. Corresponding traces of the first and second sets may have spacing therebetween of less than twenty microns. The communication path may include conductive material to electrically couple the corresponding traces of the first and second sets. The conductive material may be disposed in between the corresponding traces of the first and second sets for substantially an entire length of the corresponding traces.

Thus, trace configurations for improved communication of high-speed digital differential signals have been described. Circuit boards having traces suitable for communication of high-speed digital differential signals have also been described. The traces may communicate high-speed digital differential signals with reduced conduction loss. The traces may also communicate high-speed digital differential signals with reduced dielectric loss. The traces may also communicate high-speed digital differential signals while maintaining signal integrity.

The foregoing description of the specific embodiments reveals the general nature of the invention sufficiently that others can, by applying current knowledge, readily modify and/or adapt it for various applications without departing from the generic concept, and therefore such adaptations and modifications are intended to be comprehended within the meaning and range of equivalents of the disclosed embodiments. It is to be understood that the phraseology or terminology employed herein is for the purpose of description and not of limitation. Accordingly, the invention is intended to embrace all such alternatives, modifications, equivalents and variations as fall within the spirit and broad scope of the appended claims.

What is claimed is:

1. A circuit board having parallel conductors to carry a digital differential signal comprising:

a ground plane;

a first set of conductive traces having a first width dimension disposed on insulating material;

a second set of conductive traces having the first width dimension and being parallel to the first set and disposed within the insulating material for an entire length of the first set, the second set being separated from the first set by a height dimension within the insulating material; and conductive material to electrically couple the corresponding traces of the first and second sets, the conductive material having the height dimension and being disposed in between the corresponding traces of the first and second sets for substantially the entire length of the corresponding traces, wherein the conductive material has a second width dimension less than the first width dimension, the first and second width dimensions being parallel, wherein the first and second sets of conductive traces run substantially parallel to the ground plane, wherein the second width dimension is substantially less than the first width dimension, and wherein the corresponding traces of the first and second sets carry opposite portions of the digital differential signal, wherein the ground plane is copper and is on a side of the non-conductive material opposite from the second set of conductive traces, and wherein a separation between the conductive traces of the first set and between the conductive traces of the second set is selected to provide coupling between the opposite portions of the digital differential signal.

2. The circuit board of claim 1 wherein the insulating material has a dielectric constant (Er) ranging approximately between 3 and 4.

3. The circuit board of claim 1 wherein the digital differential signal is a high-speed digital differential signal having a transition-rate of at least one giga-transition per second.

4. The circuit board of claim 1 wherein the conductive traces of the first and second sets are either copper or a copper alloy.

5. A circuit board having parallel conductors for communicating a high-speed digital signal comprising:

insulating material;

a first set of conductive traces having a first width dimension disposed on the insulating material;

a second set of conductive traces having the first width dimension and being parallel to the first set and disposed within the insulating material for an entire length of the first set, the second set being separated from the first set by a height dimension within the insulating material; and conductive material to electrically couple the corresponding traces of the first and second sets, the conductive material having the height dimension being disposed in between the corresponding traces of the first and second sets for substantially the entire length of the corresponding traces, wherein the conductive material has a second width dimension less than the first width dimension, the first and second width dimensions being parallel, wherein the second width dimension is substantially less than the first width dimension, wherein the corresponding traces of the first and second sets carry opposite portions of the digital differential signal, and wherein a separation between the conductive traces of the first set and between the conductive traces of the second set is selected to provide coupling between the opposite portions of the digital differential signal.

6. The circuit board of claim 5 wherein the digital differential signal is a high-speed digital differential signal having a transition-rate of at least one giga-transition per second.

7. The circuit board of claim 5 wherein the conductive traces are comprised of either copper or a copper alloy, and wherein the insulating material has a dielectric constant (Er) ranging approximately between 3 and 4.

8. An interposer substrate having parallel conductors to carry a digital differential signal comprising:

a ground plane;

insulating material;

a first set of conductive traces having a first width dimension disposed on insulating material;

a second set of conductive traces having the first width dimension and being parallel to the first set and disposed within the insulating material for an entire length of the first set, the second set being separated from the first set by a height dimension within the insulating material; and conductive material to electrically couple the corresponding traces of the first and second sets, the conductive material having the height dimension and being disposed in between the corresponding traces of the first and second sets for substantially the entire length of the corresponding traces, wherein the pair of conductive traces runs substantially parallel to the ground plane, wherein the second width dimension is substantially less than the first width dimension, wherein the corresponding traces of the first and second sets carry opposite portions of the digital differential signal, and wherein a separation between the conductive traces of the first set and between the conductive traces of the second set is selected to provide coupling between the opposite portions of the digital differential signal.

9. The interposer substrate of claim 8 wherein the digital differential signal is a high-speed digital differential signal having a transition-rate of at least one giga-transition per second.

10. A package for a semiconductor die:

a ground plane;

insulating material; and a first set of conductive traces having a first width dimension disposed on insulating material;

a second set of conductive traces having the first width dimension and being parallel to the first set and disposed within the insulating material for an entire length of the first set, the second set being separated from the first set by a height dimension within the insulating material; and conductive material to electrically couple the corresponding traces of the first and second sets, the conductive material having the height dimension and being disposed in between the corresponding traces of the first and second sets for substantially the entire length of the corresponding traces, wherein the conductive material has a second width dimension less than the first width dimension, the first and second width dimensions being parallel, wherein the pair of conductive traces runs substantially parallel to the ground plane, wherein the second width dimension is substantially less than the first width dimension, wherein the corresponding traces of the first and second sets carry opposite portions of the digital differential signal and wherein a separation between the conductive traces of the first set and between the conductive traces of the second set is selected to provide coupling between the opposite portions of the digital differential signal.

11. The package of claim 10 wherein the digital differential signal is a digital differential signal having a transition-rate of at least one giga-transition per second.

12. A system comprising:

a first communication element to provide a digital differential signal;

a second communication element to receive the digital differential signal; and a communication path between the first and second communication elements to carry the digital differential signal with parallel conductors, the communication path comprising:

a first set of conductive traces having a first width dimension disposed on insulating material;

a second set of conductive traces having the first width dimension and being parallel to the first set and disposed within the insulating material for an entire length of the first set, the second set being separated from the first set by a height dimension within the insulating material; and conductive material to electrically couple the corresponding traces of the first and second sets, the conductive material having the height dimension and being disposed in between the corresponding traces of the first and second sets for substantially the entire length of the corresponding traces, wherein the conductive material has a second width dimension less than the first width dimension, the first and second width dimensions being parallel, wherein the second width dimension is substantially less than the first width dimension, wherein the corresponding traces of the first and second sets carry opposite portions of the digital differential signal, and wherein a separation between the conductive traces of the first set and between the conductive traces of the second set is selected to provide coupling between the opposite portions of the digital differential signal.

13. The system of claim 12 wherein the digital signal is a high-speed digital differential signal having a transition rate of at least one giga-transition per second and the first and second communication elements are part of a computer system.

14. The system of claim 13 wherein the height dimension is less than twenty microns.

* * * * *